(12) United States Patent
Belashchenko et al.

(10) Patent No.: US 10,090,034 B2
(45) Date of Patent: Oct. 2, 2018

(54) MAGNETOELECTRIC MEMORY CELLS WITH DOMAIN-WALL-MEDIATED SWITCHING

(71) Applicant: Board of Regents of the University of Nebraska, Lincoln, NE (US)

(72) Inventors: Kirill D. Belashchenko, Lincoln, NE (US); Oleg Tchernyshyov, Baltimore, MD (US); Alexey Kovalev, Lincoln, NE (US); Dmitri E. Nikonov, Beaverton, OR (US)

(73) Assignees: BOARD OF REGENTS OF THE UNIVERSITY OF NEBRASKA, Lincoln, NE (US); THE JOHN HOPKINS UNIVERSITY, Baltimore, MD (US); INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/807,369

(22) Filed: Nov. 8, 2017

(65) Prior Publication Data

US 2018/0130511 A1    May 10, 2018

Related U.S. Application Data

(60) Provisional application No. 62/418,882, filed on Nov. 8, 2016.

(51) Int. Cl.
*G11C 11/16* (2006.01)
*H01L 43/08* (2006.01)
*H01L 27/22* (2006.01)
*H01L 43/10* (2006.01)

(52) U.S. Cl.
CPC ........ *G11C 11/161* (2013.01); *G11C 11/1673* (2013.01); *G11C 11/1675* (2013.01); *H01L 27/228* (2013.01); *H01L 43/08* (2013.01); *H01L 43/10* (2013.01)

(58) Field of Classification Search
CPC .............. G11C 11/161; G11C 11/1675; G11C 11/1673; H01L 43/10; H01L 43/08; H01L 27/228
See application file for complete search history.

(56) References Cited

U.S. PATENT DOCUMENTS

| 2009/0315088 A1* | 12/2009 | Xi ........................... G11C 11/22 257/295 |
| 2018/0033954 A1* | 2/2018 | Aradhya .................. H01L 43/06 |

* cited by examiner

*Primary Examiner* — Ajay Ojha
(74) *Attorney, Agent, or Firm* — Talem IP Law, LLP

(57) ABSTRACT

A magnetoelectric memory cell with domain-wall-mediated switching is implemented using a split gate architecture. The split gate architecture allows a domain wall to be trapped within a magnetoelectric antiferromagnetic (MEAF) active layer. An extension of this architecture applies to multiple-gate linear arrays that can offer advantages in memory density, programmability, and logic functionality. Applying a small anisotropic in-plane shear strain to the MEAF can block domain wall precession to improve reliability and speed of switching.

20 Claims, 6 Drawing Sheets

MAGNETOELECTRIC MEMORY CELLS WITH DOMAIN-WALL-MEDIATED SWITCHING

CROSS-REFERENCE TO RELATED APPLICATION

The present invention claims the benefit of U.S. Provisional Application Ser. No. 62/418,882, filed Nov. 8, 2016, which is hereby incorporated by reference in its entirety, including any figures, tables, and drawings.

GOVERNMENT SUPPORT

This invention was made with government support under E-FG02-08ER46544 and DE-SC0014189 awarded by the Department of Energy, DMR1420645 awarded by the National Science Foundation, and Cooperative Agreement No. 70NANB12H107 awarded by NIST. The U.S. Government has certain rights in this invention.

BACKGROUND

Magnetoelectric devices are gaining in popularity for their low power applications. Encoding and manipulation of information by the antiferromagnetic (AFM) order parameter has recently attracted considerable attention due to its possible applications in magnetoelectric devices utilizing electric control of magnetization. Device concepts utilizing a magnetoelectric antiferromagnetic (MEAF) as the active element are being pursued for applications in nonvolatile memory and logic. AFM order occurs when the magnetic moments of a material align in a pattern with neighboring spins of electrons pointing in opposite directions, which often occurs at temperatures below the Neel temperature of the material.

SUMMARY

Magnetoelectric memory devices with domain-wall mediated switching are presented. A memory cell according to an example described herein includes an electrode, a magnetoelectric layer coupled to the top of the electrode, a first set gate on top of the magnetoelectric layer towards one end of the magnetoelectric layer, a second set gate on top of the magnetoelectric layer towards an opposite end of the magnetoelectric layer from the first set gate, and a control gate on top of the magnetoelectric layer and positioned between the first set gate and the second set gate. During operation, a voltage with positive polarity is applied to the first set gate and a voltage with negative polarity is applied to the second set gate. Application of a positive or negative voltage to the control gate changes the logic state of the memory cell, thus, storing a bit value. The set gates are activated during a write operation, ensuring the fixed domain states in the magnetoelectric layer are maintained, and trapping the domain wall inside the bit. Additionally, applying an in-plane shear strain to the magnetoelectric layer can improve the reliability and switching speed of the memory cell. A nonvolatile magnetoelectric memory array can also be realized by using a shared set gate design.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

Figure 1:
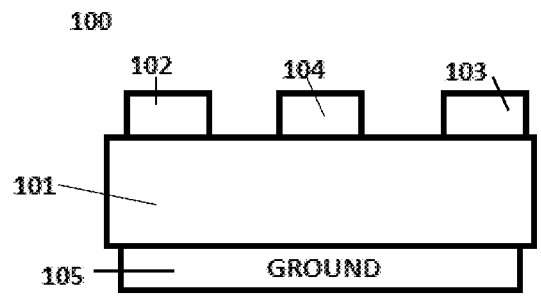
FIG. 1 shows an example magnetoelectric memory cell with split gate design.

Magnetoelectric memory devices with domain-wall mediated switching are presented. A memory cell according to an example described herein includes an electrode, a magnetoelectric layer coupled to the top of the electrode, a first set gate on top of the magnetoelectric layer towards one end of the magnetoelectric layer, a second set gate on top of the magnetoelectric layer towards an opposite end of the magnetoelectric layer from the first set gate, and a control gate on top of the magnetoelectric layer and positioned between the first set gate and the second set gate. The magnetoelectric layer can be, for example, antiferromagnetic (AFM), ferrimagnetic, or ferroelectric (such as $BiFeO_3$). The first set gate and the second set gate form a split gate structure.

During operation, a voltage with positive polarity is applied to the first set gate and a voltage with negative polarity is applied to the second set gate. Application of a positive or negative voltage to the control gate changes the logic state of the memory cell, thus, storing a bit value. The set gates are activated during a write operation, ensuring the fixed domain states in the magnetoelectric layer are maintained, and trapping the domain wall inside the bit. Additionally, applying an in-plane shear strain to the magnetoelectric layer can improve the reliability and switching speed of the memory cell. A nonvolatile magnetoelectric memory array can also be realized by using a shared set gate design.

In an example implementation where the magnetoelectric layer is an AFM layer, the AFM layer can be switched between two different antiferromagnetic domain states. The selection of one of the AFM domain states can serve as a nonvolatile information carrier. Information can be recorded in this manner. Magnetoelectric materials, including AFM, are suitable for this purpose for several reasons. One reason is because magnetoelectric materials can be switched by applying magnetic and electric fields at the same time, which can allow the magnetoelectric material to be switched by the simple application of voltage. Another reason is because a magnetoelectric material has a magnetized surface or interface with another material, which can be used to read the memory information, in the form of a bit, that has been recorded.

A magnetoelectric memory device with an AFM layer can include a split gate scheme to trap a domain wall inside the magnetoelectric active element of the MEAF material. As used herein, "split gate" refers to gate electrodes placed on opposite sides of a switched region. A split gate can inhibit the domain wall from escaping from the magnetoelectric active element when switched. Opposite polarity can be applied to the split gates. At the time a bit is written, the gate with a positive polarity will enforce AFM order in one direction, and the gate with negative polarity will enforce AFM order in the opposite direction. Advantageously, the described magnetoelectric memory device can provide efficient and stable switching between two AFM domain states.

MEAFs typically have two antiferromagnetic macroscopically distinguishable domain states, which map onto each other by a time reversal operation. In particular, the magnetoelectric response has opposite signs in the AFM domain of two different types. Simultaneous application of both electric and magnetic fields exerts pressure on the domain walls in a MEAF, as the magnetic field interacts with the magnetization induced by the electric field. During this simultaneous application, the domain walls move so that all domains of one type shrink while the domains of the other type expand. Compared to other known switching techniques, the magnetization induced in a MEAF by an electric field is small because the pressure acting on the domain walls is small.

The split gate architecture of the magnetoelectric memory device is advantageous over a single gate architecture because the two gates of the split gate architecture confine the domain wall to provide stability and inhibit the domain wall from escaping from the area within the MEAF during switching.

Current magnetoelectric memory devices implementing a single gate scheme generally have a film with a top and a bottom electrode. The single gate device is switched when a voltage is applied to the single gate (i.e., top electrode). In contrast to the split gate architecture of embodiments described herein, at nano-scale, for a single bit, the domain walls can escape to the edge of the film in the single gate device and become annihilated. Further, if the bit in the single gate scheme is switched backwards, the reverse domain would need to be nucleated, which can be a slow and unreliable process.

FIG. 1 shows an example magnetoelectric memory cell with split gate design. Referring to FIG. 1, a memory cell 100 can include a MEAF layer 101. For the split gate design, a first set gate 102 is positioned on top of the MEAF layer 101 towards one end, a second set gate 103 is positioned on top of the MEAF layer 101 towards an opposite end from the first set gate 102, and a control gate 104 is positioned on top of the MEAF layer 101 between the first set gate 102 and the second set gate 103. A ground electrode 105 is coupled to the bottom of MEAF layer 101 to provide an electrical ground for the memory cell 100 (and support appropriate electric field configuration). Prior to first operation of the memory cell 100, the memory cell 100 can be initialized by applying a first voltage to the first set gate 102, applying a second voltage to the second set gate 103, and applying a third voltage to the control gate 104 for a sufficient amount of time to enforce one domain wall. The first voltage, second voltage, and third voltage can be the same or different. Once a domain wall is established, the normal operation can commence.

Figure 2A:
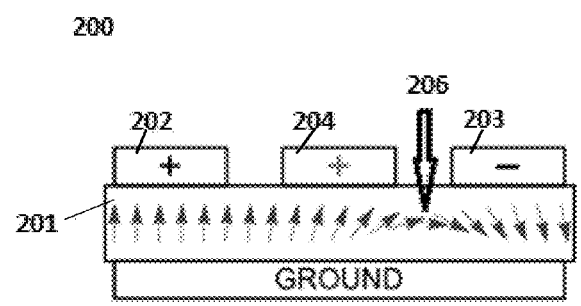
FIGS. 2A and 2B illustrate logical state ONE and ZERO in an example memory cell.
Figure 2B:
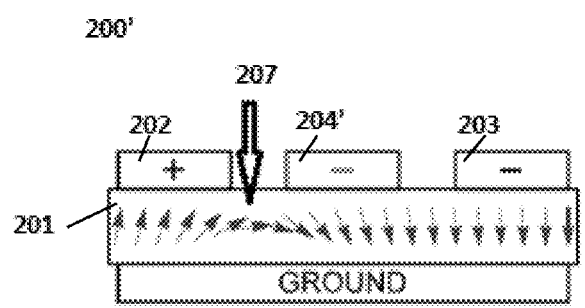

Each memory cell can store a single bit—either a logical state ONE or logical state ZERO. The logic state stored in the memory cell is dependent on the polarity of the voltage applied to the control gate. FIGS. 2A and 2B illustrate logical state ONE and ZERO in an example memory cell. FIG. 2A shows an example of a memory cell 200 with logical state ONE and FIG. 2B shows an example of a memory cell 200' with logical state ZERO. In FIGS. 2A and 2B, the first set gate 202 is activated by positive voltage pulses and the second set gate 203 is activated by negative voltage pulses during a write operation to the memory cell 200 or 200'. Activating the set gates 202 and 203 with opposite polarities during the write operation ensures that the fixed AFM domain states in the MEAF layer 201 are maintained and the domain wall is trapped inside the memory cell 200 or 200'.

In FIG. 2A, which depicts a logical state ONE, application of a positive voltage to control gate 204 creates an electric field inside the MEAF layer 201 and selects one of the two AFM domain states. A domain wall 206 is trapped between 203 and 204 and the logic state of memory cell 200 can be recorded. Similarly, in FIG. 2B, which depicts a logical state ZERO, application of a negative voltage to control gate 204' creates an electric field inside the MEAF layer 201 and domain wall 207 is trapped between 202 and 204 and the logic state of the memory cell 200' is recorded. Additionally, a permanent magnetic field is applied vertically (not shown) to the memory cell 200 or 200'.

The arrows within the MEAF layer 201 show the orientation of the AFM order parameter, and more specifically, the orientation reversal at the domain walls 206 and 207. The arrows may also be taken to represent the boundary magnetization at the top surface of the MEAF layer 201. In a magnetoelectric memory cell, a bit of information stored in an AFM order parameter of a MEAF is nonvolatile if the volume of the MEAF is large enough, for example, about $10^4$ nm$^3$ for $Cr_2O_3$, to make its AFM domain state stable against thermally-induced fluctuations. The surface, or interface with another material, of MEAF exhibits boundary magnetization, which means the MEAF can be magnetized in thermodynamic equilibrium, even in the presence of roughness. Contrary to the magnetoelectric effect in the bulk, the surface or interface magnetization of a MEAF is not small and all spins at the surface point in the same direction (even in the presence of roughness) if the bulk is in the single-domain state. The boundary magnetization has opposite signs for the two different AFM domain types. This boundary magnetization can be detected by a magnetic probe, such as a magnetic tunnel junction (MTJ) with its magnetically soft ferromagnetic electrode deposited on top of the MEAF layer. An alternative readout mechanism could, for example, also utilize proximity-induced anomalous Hall effect (AFE) in a normal metal overlayer, such as Pt deposited on top of the MEAF.

The MEAF material can be, for example, pure or doped $Cr_2O_3$, or a $Cr_2O_3$ alloy film with uniaxial magnetocrystalline anisotropy with the easy axis oriented perpendicular to the film plane. The dopant can be, for example, boron. The magnetoelectric memory cell device requires a constant magnetic field, on the order of approximately 100 Oe or greater, to be applied perpendicular to the film in the case of the $Cr_2O_3$ film. The constant magnetic field can be applied using one or more permanent magnets.

Additionally, the reliability and switching speed of the device can be significantly improved by applying an anisotropic in-plane shear strain to the MEAF. Application of anisotropic in-plane shear strain to the MEAF blocks the domain wall precession. The in-plane shear strain can be applied to the device, for example, by using a piezoelectric element, an anisotropic substrate, or anisotropic thermal expansion in a patterned structure. In another embodiment for applying strain to the MEAF, a uniaxial strain in the MEAF can be applied by creating notches, or insertions, in the MEAF that are filled, for example, by epitaxially grown Al-doped $Cr_2O_3$. The epitaxially grown Al-doped $Cr_2O_3$ has a different lattice parameter than $Cr_2O_3$ and therefore creates strain in the MEAF.

Figure 3A:
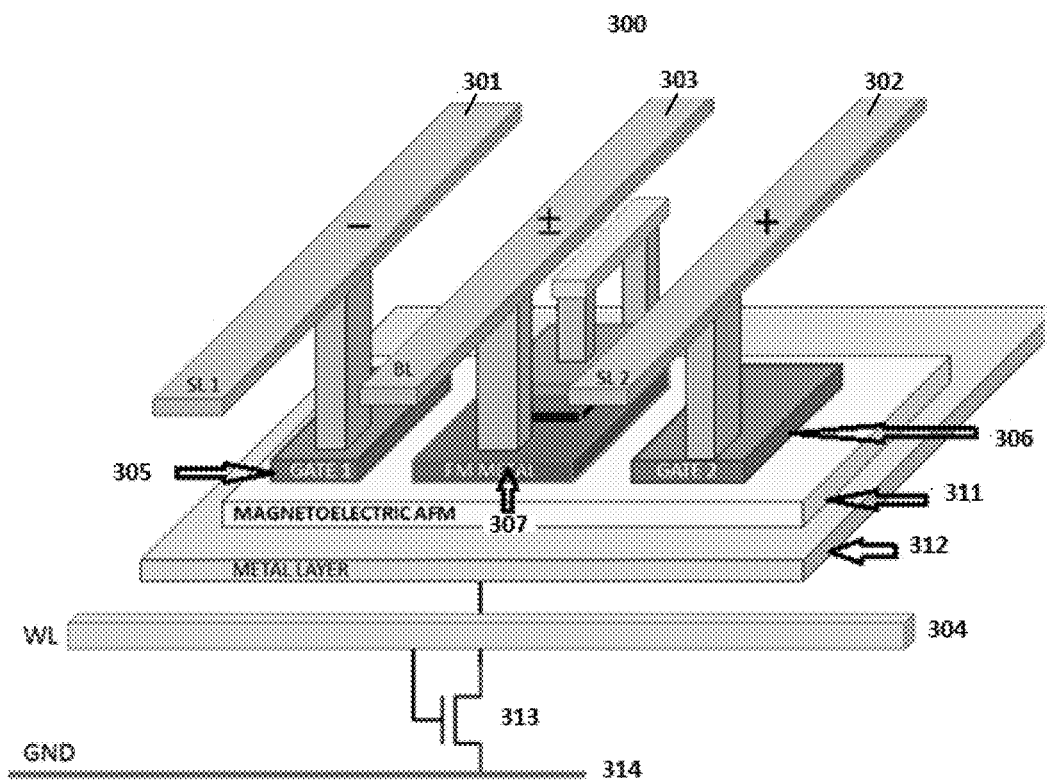
FIG. 3A shows an embodiment of a multiple-gate magnetoelectric memory cell design.
Figure 4:
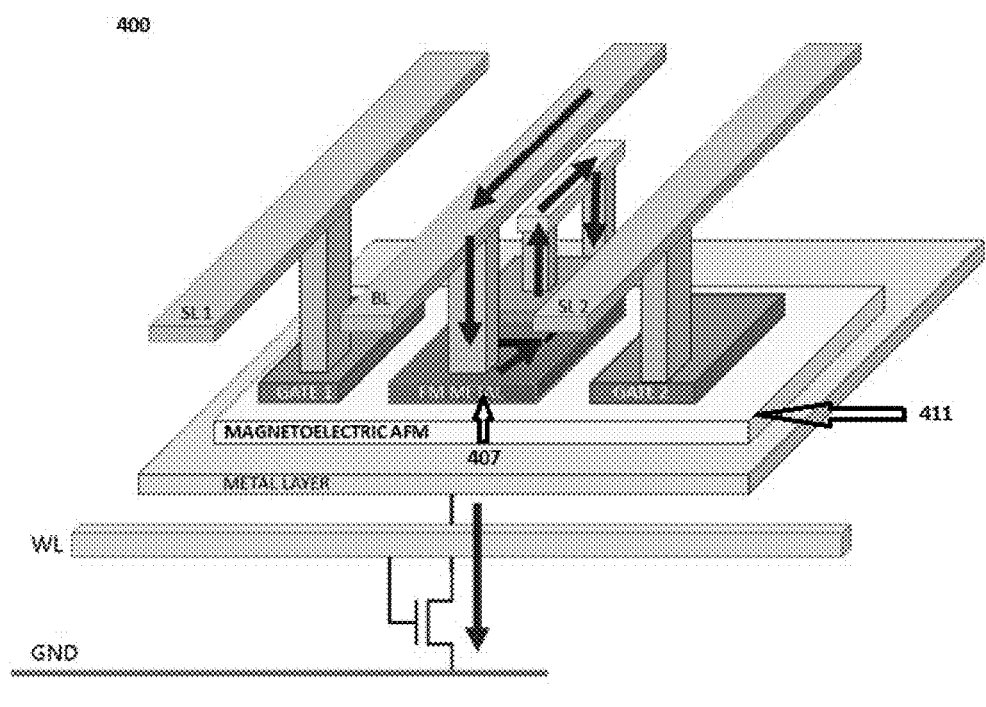
FIG. 4 shows the current path during a read operation of an example magnetoelectric memory cell.
Figure 7A:
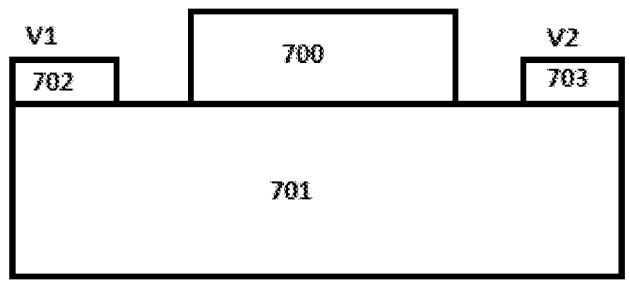
FIGS. 7A-7D show several examples of devices incorporating various implementations for applying an anisotropic in-plane shear strain.
Figure 7B:
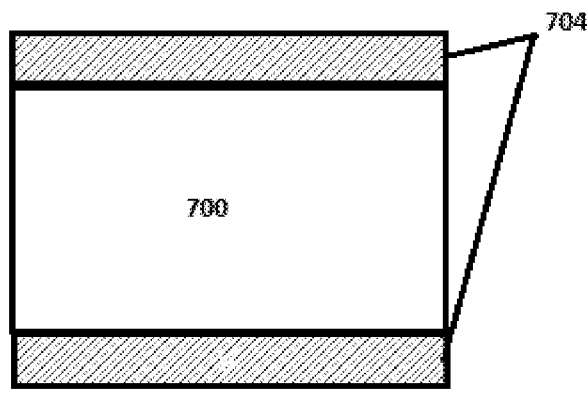
Figure 7C:
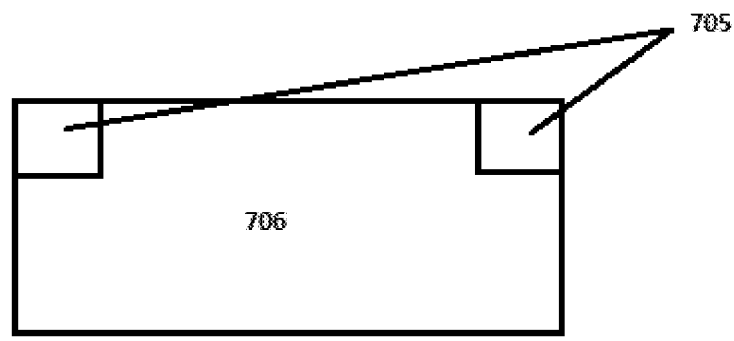
Figure 7D:
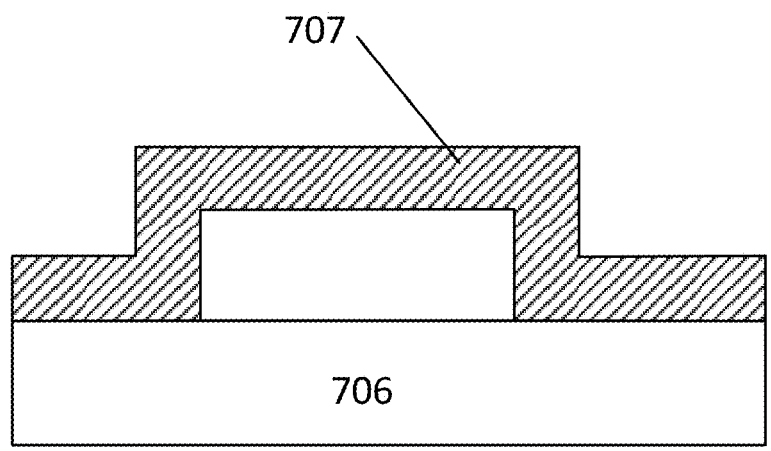

FIGS. 7A-7D show several examples of devices incorporating various implementations for applying an anisotropic in-plane shear strain. FIG. 7A shows an embodiment of applying an in-plane shear strain by using a piezoelectric element. Referring to FIG. 7A, a memory device 700 is positioned on a piezoelectric element 701. A first contact pad 702 and a second contact pad 703 are on top of the piezoelectric element 701. The memory device 700 may be implemented, for example, as shown in FIG. 1, 3A, or 4. The in-plane shear strain can be optimized by the placement of the first contact pad 702 and second contact pad 703. In-plane shear strain is applied to the device 700 when a first voltage, V1, is applied to the first contact pad 702 and a second voltage, V2, is applied to the second contact pad 703. FIG. 7B shows a top view of a patterned structure with anisotropic thermal expansion. The patterned structure 704 with a different thermal expansion coefficient than the memory device 700 is positioned adjacent to the memory device 700. FIG. 7C shows regions 705 of a material different than the material of the magnetoelectric layer 706 within the magnetoelectric layer 706. These regions 705 may be formed by inserting materials with a different lattice structure than the magnetoelectric layer material or by implanting dopants into the region. FIG. 7D shows a material layer 707 with a different lattice constant than the magnetoelectric layer 706 applied over the memory cell. Any of the above described strain-applying structures can provide the means for applying anisotropic in-plane shear stress.

Figure 3B:
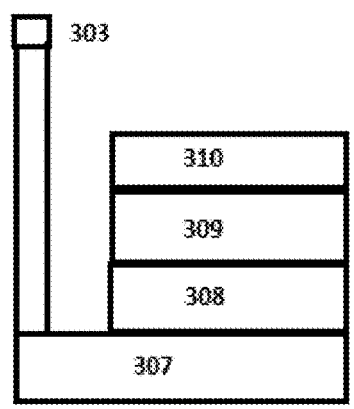
FIG. 3B shows a cross-sectional view of a MTJ that may be used to provide a control gate.

In some cases, the magnetoelectric memory cell can expand to include multiple gates. FIG. 3A shows an embodiment of a multiple-gate magnetoelectric memory cell design. The magnetoelectric memory cell 300 comprises a set line 1 301 (referred to as SL1), set line 2 302 (referred to as SL2), bit line 303 (referred to as BL), and word line 304 (referred to as WL). SL1 301 is electrically connected to Gate 1 305 (e.g., a first set gate) and SL2 302 is electrically connected to Gate 2 306 (e.g., a second set gate). Gate 1 305 and Gate 2 306 are nonmagnetic gate electrodes. BL 303 is electrically connected to a ferromagnetic (FM) metal layer 307 of a magnetic tunnel junction (MTJ). The MTJ (e.g., the FM layer 307) can provide the control gate. FIG. 3B shows a cross-sectional view of a MTJ that may be used to provide a control gate. Additional MTJ layers include an insulating spacer 308, a FM layer 309, and a pinning layer 310 as the top layer of the MTJ. Gate 1 305, Gate 2 306 and the FM metal layer 307 are on top of a MEAF layer 311 with the FM metal layer 307 exchange-coupled to the boundary magnetization of the MEAF layer 311. The MEAF layer 311 is on a metal layer 312, which is connected to the drain of a transistor 313. WL 304 is connected to the gate of transistor 313 and the source of transistor 313 is connected to a ground line 314 (referred to as GND).

For a write operation, using FIG. 3A as an example, a logical "1" is applied to WL 304. Next, simultaneously, a negative voltage is applied to SL1 301 and a positive voltage is applied to SL2 302. Applying a negative voltage to BL 303 will result in writing a "0" to the memory cell 300 and will move the domain wall as shown in FIG. 2B. Applying a positive voltage to BL 303 will result in writing a "1" to the memory cell 300 and will move the domain wall as shown in FIG. 2A. The bottom FM layer 307 of the MTJ reverses via exchange bias when the domain wall moves.

To perform a readout of the AFM domain state of the magnetoelectric memory cell 300, a logical "1" is applied to WL 304. The resistance between BL 303 and GND 314 is compared at a low voltage.

FIG. 4 shows the current path during a readout operation of an example magnetoelectric memory cell. The magnetoelectric memory cell 400 may be implemented such as described with respect to FIGS. 3A and 3B. The AFM domain state can be detected (readout) by a magnetic probe that can detect boundary magnetization, such as, but not limited to a MTJ with its magnetically soft ferromagnetic electrode 407 deposited on top of an MEAF layer 411, so that it is exchange-coupled to its boundary magnetization, as shown in FIGS. 3A and 3B. An alternative readout mechanism can use proximity-induced anomalous Hall effect in a normal metal overlayer, such as Pt, deposited on top of the MEAF layer 411.

In some cases, the basic design of the split gate memory cell can be expanded to a linear array of cells with a plurality of shared set gates to increase memory density. The plurality of shared set gates can be in an alternating pattern of positive polarity and negative polarity on an MEAF layer. A plurality of control gates can be interspersed between the plurality of shared set gates on the MEAF layer. Similar to the single split gate memory cell embodiment, an anisotropic in-plane shear strain can be applied to the linear array of memory cells.

Figure 5:
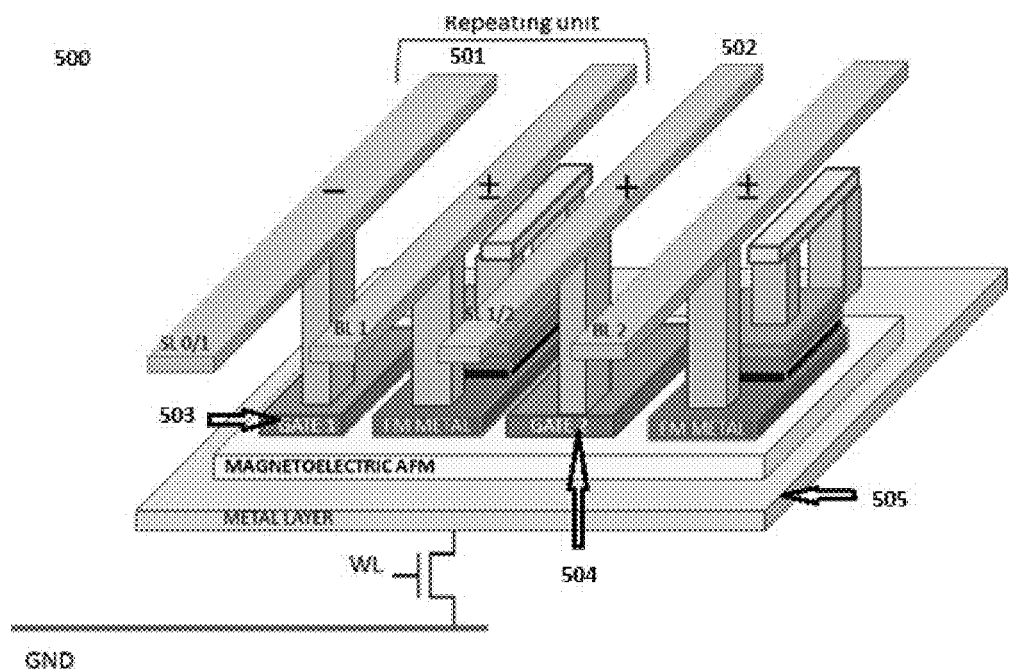
FIG. 5 shows an example of a linear array of memory elements with shared set lines.

FIG. 5 shows an example of a linear array of magnetoelectric memory elements 500 with shared set lines 501 and 502, electrically connected to set gates 503 and 504, respectively. Each set gate 503 and 504 serves to trap the domain walls on both sides, and for a long array the footprint reduces from 3 gates to 2 gates per bit (e.g., 2 gates per memory "cell" storing the bits). For example, applying a positive voltage to set line 2 (SL1/2) 502 is used to write to each of the adjacent two bits. Alternatively, the use of several control gates in sequence allows for more than two positions for each domain wall and leads to a memory density of $(\log_2 n)/n$ bits per gate, where n is the number of control gates in a sequence. While the memory density is calculated to be lowest for n=3, the gain is only approximately 6% compared to n=2 or n=4. If all gates are made identical, a linear array can offer an additional possibility for reprogramming, i.e., for designating different gates as + and − set gates. This can be implemented by applying sufficiently long voltage pulses to the new set gates to allow reliable switching. Using a bottom electrode 505, or sections of it, for magnetic readout can also allow for additional majority-gate functionality. Thus, a multiple split gate architecture can provide combined memory and logic capabilities.

Experimental Examples

The following experimental examples describe the switching mechanisms and dynamics of a moving domain wall, provide an estimation of relevant metrics, and present a proposed design of a memory cell using MEAF as an active layer. In these examples, the MEAF is a collinear MEAF, such as $Cr_2O_3$, with two macroscopically inequivalent AFM domains, mapped one onto the other by time reversal.

The driving force for the switching of a MEAF as described above is the difference $F=2E\hat{\alpha}H$ in the free energy densities of the two AFM domains, where $\hat{\alpha}$ is the magnetoelectric tensor. Thermally activated single-domain switching involves a major tradeoff between thermal stability and switching time. To significantly reduce the activation barrier for single-domain switching, the applied fields should satisfy $\alpha EH \sim K$, where K is the magnetocrystalline anisotropy constant. In $Cr_2O_3$, where $\alpha < 10^{-4}$ (Gaussian units) and $K \approx 2 \times 10^5$ erg/cm$^3$, this condition requires $EH \sim 10^{11}$ Oe×V/cm. However, fields of this magnitude are generally undesirable for device applications. Inhomogeneous switching, which involves nucleation of reverse domains and domain wall motion can provide improved switching capabilities, wherein the switching time is determined by the slower of these two mechanisms. Nucleation is a relatively slow thermally activated process and can be avoided by device engineering, as discussed below. The switching time is then limited by the domain wall motion driven by the magnetoelectric pressure F.

The magnetic dynamics in an AFM is qualitatively different from that in a ferromagnet (FM). For example, if the magnetostatic interaction is neglected, a domain wall in an ideal FM with no damping does not move, but rather precesses in the applied magnetic field. The FM domain wall velocity v in this case is proportional to the small Gilbert damping parameter $\alpha_0$. The magnetostatic interaction lifts the degeneracy of the Bloch and Néel configurations and blocks the precession, making $v \propto \alpha_0^{-1}$ as long as v does not exceed the Walker breakdown velocity $v_W$. In contrast, in an AFM, the Gilbert damping limits the terminal velocity of the wall. The dynamics of a domain wall in a MEAF, such as $Cr_2O_3$, is driven by the application of electric and magnetic fields. In a finite electric field, a MEAF turns into a nearly compensated ferrimagnet. As discussed in greater detail below, the existence of a small magnetization has important consequences for domain wall dynamics.

In a longitudinal magnetoelectric response, the magnetization induced by an electric field is parallel to the AFM order parameter, irrespective of its spatial orientation. This is the case for the exchange-driven mechanism of magnetoelectric response, which dominates MEAFs, such as $Cr_2O_3$, and many others at temperatures that are not too low. In $Cr_2O_3$, the only nonzero component of the magnetoelectric tensor in this approximation is $\alpha_\parallel = \alpha_{zz}$, where z lies along the rhombohedral axis. It can be assumed that the electric field is applied across an epitaxially grown (0001) film. Adding the Berry-phase and magnetoelectric terms to the AFM Lagrangian, the Lagrangian density of a MEAF, valid at low energies, can be expressed as $$\mathcal{L} = 2\epsilon \mathcal{J} a(n) \cdot \dot{n} + \frac{1}{2}(\rho|\dot{n}|^2 - A|\nabla n|^2 - \mathcal{K}_{\alpha\beta} n_\alpha n_\beta) - 2\epsilon \mathcal{J} \gamma H \cdot n \quad (1)$$

where n is the unit vector in the direction of the AFM order parameter (staggered magnetization) $L=(M_1-M_2)/2$, $M_1$ and $M_2$ are the sublattice magnetizations, $\mathcal{J}=L/(2\gamma)$ is the angular momentum density on one sublattice, $\rho$ is the effective inertia density, A is the exchange stiffness, and $\mathcal{K}_{\alpha\beta}$ is the magnetocrystalline anisotropy tensor. It can be assumed that the only nonzero component of this tensor is $\mathcal{K}_{zz} = -\mathcal{K} < 0$ unless otherwise noted. In the first and last terms, $$\epsilon = \frac{M_1 - M_2}{M_1 + M_2} = \alpha_\parallel E/L,$$

and a(n) is the vector potential of a magnetic monopole, $\nabla_n \times a = n$. This term is the Berry-phase contribution from the small longitudinal magnetization $M=(M_1+M_2)/2$ induced by the electric field. The last term in Eq. (1) is the magnetoelectric energy density where $\gamma$ is the gyromagnetic ratio.

The AFM field theory at E=0 has characteristic scales of time, length, and pressure $$t_0 = \sqrt{\rho/\mathcal{K}}, \quad \lambda_0 = \sqrt{A/\mathcal{K}}, \quad \in_0 = \sqrt{A\mathcal{K}}, \quad (2)$$

which have direct physical meaning. $\in_0$ is the scale of the domain wall energy per unit area. The magnon dispersion $\omega(k) = \sqrt{\omega_0^2 + s^2 k^2}$ has a gap $\omega_0 = 1/t_0$ and velocity $s = \lambda_0/t_0$. In $Cr_2O_3$, $\omega_0 = 0.68$ mV, hence $t_0 \approx 1$ ps. The magnon velocity is s=12 km/s. The length parameter $\lambda_0 = s t_0$ sets the scale of the domain wall width d. Calculations show that $\lambda_0 = 12$ nm and $d = \pi \lambda_0 \approx 38$ nm in $Cr_2O_3$. Since the domain wall should fit inside the cell, its width d sets a limitation for the downward scaling of the length of the MEAF element. To facilitate downscaling, the domain wall width d can be reduced by increasing the magnetocrystalline anisotropy of the MEAF. For example, it is known that the addition of Al increases K in $Cr_2O_3$.

The effective Lagrangian for low-energy domain wall dynamics is obtained by inserting the domain wall profile $$\cos\Theta(x) = \tanh\frac{x - X}{\lambda_0}, \quad \phi(x) = \Phi, \quad (3)$$

parameterized by the collective variables $\lambda$ and $\Phi$, in Eq. (1) and taking the integral over all space. For the MEAF domain wall this leads to $$L = \frac{1}{2}M\dot{X}^2 + \frac{1}{2}I\dot{\Phi}^2 + G\dot{X}\Phi - V(X, \Phi), \quad (4)$$

where $M = 2\rho/\lambda_0$ and $I = 2\rho\lambda_0$ are the mass and moment of inertia per unit area of the wall respectively, V is the potential energy of the wall, which in a uniaxial AFM has no dependence on $\Phi$, and $G = 4\in \mathcal{J}$ is the gyrotropic term coupling the motion of the wall to its precession, which is proportional to E.

The equations of motion for the collective coordinates are $$M\ddot{X} = -G\dot{\Phi} - \Gamma_{XX}\dot{X} + F,$$

$$I\ddot{\Phi} = G\dot{X} - \Gamma_{\Phi\Phi}\dot{\Phi} + \tau, \quad (5)$$

where $\Gamma_{XX} = 4\alpha_0 \mathcal{J}/\lambda_0$ and $\Gamma_{\Phi\Phi} = 4\alpha_0 \mathcal{J}_0$ are the viscous drag coefficients proportional to the Gilbert damping parameter $\alpha_0$, and $$F = -\frac{\partial V}{\partial X} = 2\alpha_\parallel E_z H_z = 2\epsilon L H_z.$$

The torque $$\tau = -\frac{\partial V}{\partial \Phi}$$

vanishes in the case of uniaxial anisotropy. The case of $\tau=0$ will be discussed first, followed by the role of broken axial symmetry.

A conventional AFM domain wall exists at G=0, which behaves as a massive particle subject to viscous drag, and whose angular collective variable $\Phi$ is completely passive. However, the gyrotropic coupling G induced by the electric field generates precession of the moving domain wall, which generates additional dissipation. In the steady state, the moving domain wall precesses with angular frequency $\Omega = G\dot{X}/\Gamma_{\Phi\Phi}$, the linear velocity of the wall is $$v = \frac{F}{\Gamma_{XX} + G^2/\Gamma_{\Phi\Phi}}. \quad (6)$$

Thus, the additional dissipation induced by the gyrotropic coupling reduces the terminal velocity of the domain wall by the factor $1+G^2(\Gamma_{XX}\Gamma_{\Phi\Phi})^{-1}$. By substituting the expressions for $\Gamma_{XX}$, $\Gamma_{\Phi\Phi}$, and G in Eq. (6), $$v = \frac{2\epsilon/\alpha_0}{1+(\epsilon/\alpha_0)^2} v_{max}, \quad (7)$$

Where $v_{max} = \gamma H_z \lambda_0/2$. The maximum velocity $v_{max}$ of the domain wall is reached at the optimal electric field strength $E_{max}$ corresponding to $\in = \alpha_0$. Interestingly, $v_{max}$ depends neither on the magnetoelectric coefficient nor on the Gilbert damping constant.

Using the value $\gamma = 1.76 \times 10^7$ s$^{-1}$/G and a reasonable field $H_Z = 100$ Oe, $v_{max}$ 10.6 m/s. Assuming the switchable cell size of 50 nm, a switching time of about 5 ns can be calculated. Note that the maximal MEAF domain wall mobility $v_{max}/H_Z \approx 0.1$ m/(s Oe) is 2-3 orders of magnitude smaller in this regime compared to ferromagnets, such as permalloy.

The Gilbert damping constant can be determined from the relation $T = \rho/(2\alpha_0 \mathcal{J}_0)$, where T is the relaxation time. To estimate T in $Cr_2O_3$, the width of the AFM resonance $\Delta H = 900$ Oe is used, which translates into $\Delta\omega = 1.6 \times 10^{10}$ s$^{-1}$ and $T = 1/\Delta\omega \approx 60$ ps. Using the value $K = 2 \times 10^5$ erg/cm$^3$, the inertia density $\rho = 2Kt_0^2 \approx 4 \times 10^{-19}$ g/cm can be calculated. The value of $\mathcal{J}$ is obtained from the local magnetic moment 2.76$\mu_b$ and volume $\Omega \approx 50$ Å$^3$ per formula unit. Putting these estimates together, $\alpha_0 \approx 2 \times 10^{-4}$ can be obtained.

The relation $\in = \alpha_0$ then gives $E_{max} \approx 60$ V/µm in $Cr_2O_3$, where the peak value $\alpha_\parallel \approx 10^{-4}$ reached at 260 K is used. The magnetoelectric pressure corresponding to $E=E_{max}$ and $H_Z=100$ Oe is $F_{max} = 2\alpha_0 H_Z \approx 40$ erg/cm$^3$. To put this value in perspective, in ferromagnetic iron a magnetic field of 100 Oe exerts a pressure of about $3 \times 10^5$ erg/cm$^3$ on the domain walls. The "loss" of four orders of magnitude in a MEAF is due to the small magnitude of the magnetic moment induced by the electric field. Alternatively, one can say that a 100 Oe coercivity in an MEAF at $E \sim E_{max}$ is equivalent, assuming similar material quality, to a 10 mOe coercivity in iron. Thus, reasonably fast switching of an MEAF with uniaxial anisotropy may require samples of very high quality, unless the temperature is close to the Néel point $T_N$ where the domain wall width diverges and the coercivity becomes small even in low-quality samples. In the presence of lattice imperfections, switching can be possible if the magnetoelectric pressure F applied to the domain wall exceeds the depinning pressure $F_C$. Since $T_N = 307$ K of $Cr_2O_3$ is too low for passively cooled computer applications, $Cr_2O_3$ needs to be either doped or strained to increase its $T_N$. In particular, boron doping on the Cr sublattice can raise $T_N$ significantly. Random substitutional disorder in a doped material leads to an intrinsic pinning potential and nonzero coercivity. The effective depinning pressure for this representative case can be estimated as shown below.

For simplicity, it can be assumed that B dopants modify the exchange interaction locally but do not strongly affect the magnetocrystalline anisotropy. Boron doping can enhance the exchange coupling for the Cr atoms that have a B neighbor by a factor of 2-3. The concentration of B atoms is $n=3x/\Omega$, where x is the B-for-O substitution concentration. Therefore, an estimate can be made that the exchange stiffness A is enhanced by a factor of 2 in regions of volume 2$\Omega$, whose concentration is n.

Let a* be the radius of a sphere with volume 2$\Omega$. The force acting on the domain wall from the vicinity of one B atom is $f \sim (a^*/\lambda_0)^3 A$. The typical pinning force on a portion of the domain wall of size $R^2$ then becomes $f_{pin} \sim \sqrt{(n\lambda_0 R^2 f^2)}$. The typical correlation length for the domain wall bending displacement is the Larkin length $R_C$, which can be found by equating $f_{pin}$ to the typical elastic $f_{el} \sim u\sqrt{A\mathcal{K}}$ produced by the domain wall, where $u \sim \lambda_0$ corresponds to the situation in which the domain wall deforms weakly. This gives $$R_c \sim \sqrt{\frac{\lambda_0 A \mathcal{K}}{nf^2}}.$$

The depinning threshold can then be estimated as $$F_c \sim \frac{A}{R_c^2} = n\lambda_0 A(2\Omega/\lambda_0^3)^2.$$

Using x=0.03 and $A \sim 10^{-6}$ erg/cm, $F_c \sim 10$ erg/cm$^3$ can be calculated, which is comparable to the magnetoelectric pressure at H=100 Oe and $E=E_{max}$, as estimated above. Other imperfections may further increase $F_c$. Thus, as expected from the comparison with typical ferromagnets, even weak pinning associated with homogeneous doping can impede MEAF switching. This sensitivity to lattice disorder, along with the low upper bound on the domain wall mobility, presents serious challenges for the implementation of magnetoelectric devices. It should be understood that additional considerations for supporting operation may be included to compensate for issues such as the coupling of the uncompensated magnetization to an applied magnetic field However, both of these limitations can be overcome by introducing a relatively small in-plane anisotropy component $\mathcal{K}_{yy} = \mathcal{K}_\perp$ in addition to the axial component $\mathcal{K}_{zz} = -\mathcal{K}$. Such in-plane anisotropy can be induced by applying a small in-plane shear strain to the magnetoelectric crystal, for example, by using a piezoelectric element, an anisotropic substrate, or anisotropic thermal expansion in a patterned structure. The physics of domain wall motion at $\mathcal{K}_\perp \neq 0$ is similar to Walker breakdown in ferromagnets, where the anisotropy with respect to $\Phi$ appears due to the magnetostatic interaction.

In the equations of motion (5), after integrating out the domain wall profile (3), a nonzero torque can be calculated as $\tau = -\lambda_0 \mathcal{K}_\perp \sin 2\Phi$ per unit area. There is a steady-state solution with $\dot{\Phi}=0$ and $v=F/\Gamma_{XX}$, as long as $v<v_W$, where $$\frac{v_W}{v_{max}} = 2(\mathcal{K}_\perp/F_{max})^{1/2}$$

is analogous to the Walker breakdown velocity. For example, in order to achieve $v_W\sim 100$ m/s, $\mathcal{K}_\perp$ should be approximately greater than or equal to 900 erg/cm³, which is three orders of magnitude smaller than $\mathcal{K}$. $\mathcal{K}_\perp$ of this order may be achieved with a fairly small in-plane shear strain.

Figure 6:
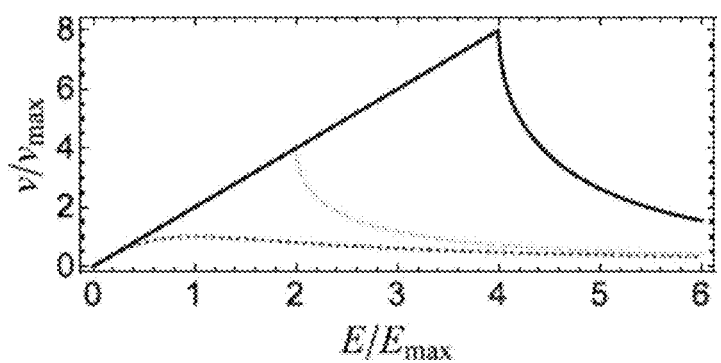
FIG. 6 shows a graph of the average domain velocity as a function of $E/E_{max}$ for a proposed design of a memory cell using MEAF as an active layer.

Below the Walker breakdown the domain wall velocity is linear in $$E: \frac{v}{v_{max}} = 2E/E_{max}. \text{ At } F > \Gamma_{XX} v_W$$

the in-plane anisotropy can no longer suppress domain wall precession, so that its velocity becomes oscillatory. The average velocity has a cusp at $F=\Gamma_{XX}v_W$ and declines with a further increase in F. FIG. 6 shows a graph of the average domain velocity as a function of $E/E_{max}$ for a proposed design of a memory cell using MEAF as an active layer. The average domain velocity, v, can be represented as a function of $E/E_{max}$ at $\mathcal{K}_\perp=0$ (dotted line), $\mathcal{K}_\perp=4F_{max}$ (dashed line), and $\mathcal{K}_\perp=16F_{max}$ (solid line).

In the presence of $\mathcal{K}_\perp \lesssim 900$ erg/cm³, the fields $E\approx 0.2$ V/nm and $H\approx 100$ Oe result in v 70 m/s and $F\approx 140$ erg/cm³. Under these conditions, the switching time of a nanoscale cell can be well below a nanosecond (e.g., at least an order of magnitude below), while the magnetoelectric pressure F exceeds the intrinsic depinning field of B-doped $Cr_2O_3$ by an order of magnitude. Additionally, the domain wall mobility can be changed by orders of magnitude by imposing a nonzero $\mathcal{K}_\perp$ in the strong-electric-field regime $\in\!\!>\!\!>\alpha_0$. This peculiar feature of MEAF domain wall dynamics can be verified experimentally.

Devices based on MEAF switching can be energy efficient. Energy dissipated when a bit is switched can be calculated as $E_{dis}=2\alpha_\parallel E_Z H_Z V=FV$, where V is the switched volume. This is the energy difference between the two AFM domain states of the bit. For example, a cube with a 50 nm edge has a switching volume estimated to be $E_{dis}\sim 10^{-14}$ erg for the field magnitudes chosen above. This corresponds to an upper limit on the intrinsic power consumption of 1 mW/Gbit, assuming that each bit is switched every nanosecond. The calculations show that energy dissipation in a magnetoelectric memory device would most likely be dominated by losses in the external circuitry. This estimate assumes that there is no leakage current flowing across the MEAF. To keep energy dissipation low, the resistance of the MEAF should be as large as possible. A large resistance of the MEAF can also enable reliable readout, because, as shown in FIG. 4, the MEAF and the MTJ are connected in parallel between the bit line and the ground line. Overall, the resistance of the MTJ should be large to reduce dissipation, and the resistance of the MEAF should be larger than that of the MTJ.

In summary, the domain wall dynamics in a magnetoelectric antiferromagnet and its implications for magnetoelectric memory applications are discussed. The domain wall mobility v/H in a uniaxial magnetoelectric antiferromagnet reaches a maximum at a certain electric field $E_{max}$ and then declines, which can be unfavorable for device applications. However, the domain wall mobility and switchability can be greatly improved by imposing a small in-plane anisotropy, which can block the domain wall precession using electric fields of $E\sim 0.2$ V/nm. A split gate architecture is proposed to trap the domain wall inside the bit element (e.g., within the cell). A linear gate array extending this architecture can offer advantages in memory density, programmability, and logic functionality integrated with nonvolatile memory. This domain-wall-driven mechanism can allow for reliable and fast switching.

It should be understood that the examples and embodiments described herein are for illustrative purposes only and that various modifications or changes in light thereof will be suggested to persons skilled in the art and other equivalent features are intended to be within the scope of the claims.

We claim:

1. A magnetoelectric memory device comprising:
   an electrode;
   a magnetoelectric layer coupled to the top of the electrode;
   a first set gate on a top of the magnetoelectric layer towards one end of the magnetoelectric layer;
   a second set gate on the top of the magnetoelectric layer towards an opposite end of the magnetoelectric layer from the first set gate;
   a control gate on the top of the magnetoelectric layer and positioned between the first set gate and the second set gate.

2. The device of claim 1, wherein the magnetoelectric layer is a magnetoelectric antiferromagnetic layer.

3. The device of claim 1, wherein the magnetoelectric layer comprises chromia, boron doped chromia, chromia alloy, or boron doped chromia alloy.

4. The device of claim 1, further comprising a means for applying an anisotropic in-plane shear strain to the device.

5. The device of claim 1, further comprising a piezoelectric element below the electrode, a first contact pad on top of the piezoelectric element, and a second contact pad on top of the piezoelectric element.

6. The device of claim 1, further comprising an anisotropic substrate below the electrode.

7. The device of claim 1, further comprising a patterned structure for anisotropic thermal expansion, the patterned structure adjacent to the magnetoelectric layer such that the magnetoelectric layer, the first set gate, the second set gate, and the control gate are within the patterned structure.

8. The device of claim 1, further comprising:
   a transistor, wherein the drain of the transistor is electrically connected to the electrode, the source of the transistor is electrically connected to a ground line, and the gate of the transistor is electrically connected to a word line;
   a magnetic tunnel junction on top of the magnetoelectric layer; and
   a bit line electrically connected to a ferromagnetic layer of the magnetic tunnel junction.

9. A method of operating the device of claim 1, comprising:
   initializing the device to enforce a domain wall in the magnetoelectric layer;
   writing a logical ONE or a logical ZERO to the device, wherein writing to the device comprises applying a positive voltage to the first set gate, applying a negative voltage to the second set gate, and applying a positive or negative voltage to the control gate; and thereby storing a logical ONE or logical ZERO into the memory device according to the polarity of the voltage applied to the control gate.

10. The method of claim 9, wherein the device further comprises: a transistor, wherein the drain of the transistor is electrically connected to the electrode, the source of the transistor is electrically connected to a ground line, and the gate of the transistor is electrically connected to a word line;

a magnetic tunnel junction on top of the magnetoelectric layer; and a bit line electrically connected to a ferromagnetic layer on the magnetic tunnel junction; the method further comprising:

reading a logical ONE or a logical ZERO from the device, wherein reading from the device comprises applying a logical ONE to the word line and comparing the resistance between the bit line and the ground line.

11. The method of claim 9, wherein writing a logical ONE in the memory device comprises applying a positive polarity to the control gate.

12. The method of claim 9, wherein writing a logical ZERO in the memory device comprises applying a negative polarity to the control gate.

13. The method of claim 9, wherein initializing the device comprises applying a first voltage to the first set gate, applying a second voltage to the second set gate, and applying a third voltage to the control gate until a domain wall is enforced.

14. A linear magnetoelectric memory device array comprising:
an electrode;
a magnetoelectric layer coupled to the top of the electrode;
a plurality of shared set gates in an alternating pattern of positive polarity and negative polarity on the magnetoelectric layer;
a plurality of control gates interspersed between the plurality of shared set gates on the magnetoelectric layer.

15. The device array of claim 14, wherein the magnetoelectric layer is a magnetoelectric antiferromagnetic layer.

16. The device array of claim 14, wherein the magnetoelectric layer comprises chromia, boron doped chromia, chromia alloy, or boron doped chromia alloy.

17. The device array of claim 14, further comprising a means for applying an anisotropic in-plane shear strain to the device.

18. The device array of claim 17, wherein the means for applying the anisotropic in-plane shear strain comprises a piezoelectric element, a first contact pad on top of the piezoelectric element below the electrode, and a second contact pad on top of the piezoelectric element.

19. The device of claim 17, wherein the means for applying the anisotropic in-plane shear strain comprises an anisotropic substrate below the electrode.

20. The device of claim 17, wherein the means for applying the anisotropic in-plane shear strain comprises a patterned structure around the device array for anisotropic thermal expansion.

* * * * *